United States Patent
Fukuhara

(10) Patent No.: US 9,379,226 B2
(45) Date of Patent: Jun. 28, 2016

(54) SEMICONDUCTOR WAFER AND INSULATED GATE FIELD EFFECT TRANSISTOR

(71) Applicant: SUMITOMO CHEMICAL COMPANY, LIMITED, Tokyo (JP)

(72) Inventor: Noboru Fukuhara, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 13/777,770

(22) Filed: Feb. 26, 2013

(65) Prior Publication Data
US 2013/0168735 A1    Jul. 4, 2013

Related U.S. Application Data

(63) Continuation-in-part of application No. PCT/JP2011/004844, filed on Aug. 30, 2011.

(30) Foreign Application Priority Data

Aug. 31, 2010  (JP) .................. 2010-195175

(51) Int. Cl.
*H01L 29/778*   (2006.01)
*H01L 29/201*   (2006.01)
(Continued)

(52) U.S. Cl.
CPC .......... *H01L 29/778* (2013.01); *H01L 29/1029* (2013.01); *H01L 29/201* (2013.01);
(Continued)

(58) Field of Classification Search
CPC ... H01L 29/778; H01L 29/1029; H01L 29/36; H01L 29/7785; H01L 29/205; H01L 29/201; H01L 29/66462; H01L 29/517; H01L 29/51
See application file for complete search history.

(56) References Cited

U.S. PATENT DOCUMENTS 5,504,353 A    4/1996 Kuzuhara
2004/0137673 A1    7/2004 Passlack et al.
(Continued)

FOREIGN PATENT DOCUMENTS

JP    6-69248 A    3/1994
JP    06-349862    12/1994
(Continued)

OTHER PUBLICATIONS

Machine translation for above JP2002-324813.*
(Continued)

*Primary Examiner* — Joshua King
*Assistant Examiner* — Mohammed R Alam
(74) *Attorney, Agent, or Firm* — Sughrue Mion, PLLC

(57) ABSTRACT

Provided is a technique capable of realizing an insulated gate (MIS-type) P-HEMT structure with good transistor characteristics such as an improved carrier mobility of a channel layer and a reduced influence from interface states. A semiconductor wafer includes a base wafer, a first crystalline layer, and an insulating layer. The base wafer, the first crystalline layer, and the insulating layer are stacked in the order of the base wafer, the first crystalline layer, and the insulating layer. The first crystalline layer is made of $In_xGa_{1-x}As$ ($0.35 \leq x \leq 0.43$) that can pseudo-lattice-match with GaAs or AlGaAs. The first crystalline layer is usable as a channel layer of a field effect transistor, and the insulating layer is usable as a gate insulating layer of the field effect transistor.

7 Claims, 12 Drawing Sheets

(51) Int. Cl.
*H01L 29/205* (2006.01)
*H01L 29/66* (2006.01)
*H01L 29/36* (2006.01)
*H01L 29/10* (2006.01)
*H01L 29/51* (2006.01)

(52) U.S. Cl.
CPC .............. *H01L29/205* (2013.01); *H01L 29/36* (2013.01); *H01L 29/66462* (2013.01); *H01L 29/7785* (2013.01); *H01L 29/51* (2013.01); *H01L 29/517* (2013.01)

(56) References Cited

U.S. PATENT DOCUMENTS

| | | | | |
|---|---|---|---|---|
| 2005/0104087 | A1* | 5/2005 | Lan | H03F 1/301 257/197 |
| 2006/0076576 | A1* | 4/2006 | Osada et al. | 257/192 |
| 2006/0113563 | A1* | 6/2006 | Osada et al. | 257/192 |
| 2006/0192228 | A1* | 8/2006 | Nakano et al. | 257/192 |
| 2007/0052048 | A1* | 3/2007 | Hoke | 257/431 |
| 2009/0166642 | A1* | 7/2009 | Nakano | 257/75 |
| 2010/0148153 | A1 | 6/2010 | Hudait et al. | |
| 2011/0147712 | A1* | 6/2011 | Radosavljevic et al. | 257/24 |

FOREIGN PATENT DOCUMENTS

| | | | |
|---|---|---|---|
| JP | 07-335867 | | 12/1995 |
| JP | 10-275806 | A | 10/1998 |
| JP | 2001-332718 | A | 11/2001 |
| JP | 2002-324813 | * | 11/2002 |
| JP | 2002-324813 | A | 11/2002 |
| JP | 2004-207471 | A | 7/2004 |
| JP | 2004-207473 | A | 7/2004 |
| JP | 2006-245200 | A | 9/2006 |
| JP | 2009-71061 | A | 4/2009 |
| WO | 2004/059744 | A1 | 7/2004 |
| WO | 2010074906 | | 7/2010 |

OTHER PUBLICATIONS

International Preliminary Report on Patentability and Written Opinion mailed Mar. 21, 2013 in International Application No. PCT/JP2011/004844 to Sumitomo Chemical Co., Ltd.

Matthias Passlak, et al., "High mobility NMOSFET Structure With High-k Dielectric", IEEE Electron Device Letters, vol. 26, No. 10, Oct. 2005, pp. 713-715.

Office Action issued Feb. 24, 2015 in Japanese Patent Application No. 2011-187828.

Chinese Office Action issued on Dec. 29, 2014 in Chinese Application No. 201180040410.3.

* cited by examiner

SEMICONDUCTOR WAFER AND INSULATED GATE FIELD EFFECT TRANSISTOR

The contents of the following Japanese patent application and PCT patent application are incorporated herein by reference:
No. JP2010-195175 filed on Aug. 31, 2010, and
No. PCT/JP2011/004844 filed on Aug. 30, 2011.

TECHNICAL FIELD

The present invention relates to a semiconductor wafer and an insulated gate field effect transistor.

BACKGROUND ART

A structure for further increasing the electron mobility and the electron density of a high electron mobility transistor (HEMT) includes a pseudomorphic high electron mobility transistor (P-HEMT) structure. With the most made of their high mobility characteristic, P-HEMTs having a Schottky gate structure or a pn junction gate structure are widely used in high-frequency communication devices.

Patent Document 1 and Patent Document 2 disclose epitaxial wafers for P-HEMTs. The epitaxial wafers disclosed in these documents use an InGaAs layer as a strained channel layer, and AlGaAs layers as a front-side and a back-side electron supply layers. Patent Document 1 describes that the In composition of the strained channel layer is 0.25 or more. Patent Document 1 further describes that optimization of the In composition and the thickness of the strained channel layer would result in an electron mobility of the strained channel layer of 8300 cm$^2$/V·s or higher at 300 K (the maximum value that is explicitly shown is 8990 cm$^2$/V·s). Patent Document 2 describes that optimization of the In composition and the thickness of the strained channel layer would result in an emission peak wavelength of the strained channel layer of 1030 nm or more at 77 K (the maximum value that is explicitly shown is 1075 nm). The electron mobility was measured by Hall measurement (Van der Pauw method). Patent Document 3 discloses an interfacial structure between an insulator and a compound semiconductor. Patent Document 3 discloses that this interfacial structure between an insulator and a compound semiconductor includes a compound semiconductor, a spacer layer provided directly or indirectly on the surface of the compound semiconductor, and an insulating layer provided directly or indirectly on the spacer layer, and that the spacer layer is made of a semiconductor substance having a bandgap wider than the badgap of the compound semiconductor.

Patent Document 1 Japanese Patent Application Publication No. 2004-207471
Patent Document 2 Japanese Patent Application Publication No. 2004-207473
Patent Document 3 Japanese Patent Application Publication No. H10-275806

DISCLOSURE OF THE INVENTION

Problems to be Solved by the Invention

With the P-HEMT structure described in Patent Document 1 or Patent Document 2, it is possible to obtain a high electron mobility and a high two-dimensional electron gas concentration. To obtain better transistor characteristics such as a higher gate breakdown voltage, it is desirable to realize a MIS (Metal-Insulator-Semiconductor) type gate structure as shown in Patent Document 3.

However, if a MIS-type gate structure is used, interface states will inevitably be formed at the interface between the insulator and the semiconductor. The interface state density at the interface between the insulator and the semiconductor is difficult to reduce, unlike the interface state density at an interface between a semiconductor and a semiconductor (at a hetero interface). The interface states might degrade the electric-field controllability of the carriers in a channel, and might make the operation speed slower due to charging and discharging the interface states. Furthermore, the interface states might possibly be a factor of carrier reduction due to interface recombination, etc. In other words, the interface states might be a factor that causes a deterioration of transistor characteristics, such as reduction of the carrier mobility. An object of the present invention is to provide a technique capable of realizing an insulated gate (MIS-type) P-HEMT structure with good transistor characteristics such as an improved carrier mobility of a channel layer and a reduced influence from the interface states.

Means for Solving the Problems

For a solution to the above-mentioned problems, according to the first aspect related to the present invention, provided is one exemplary semiconductor wafer, including a base wafer, a first crystalline layer, and an insulating layer, wherein the base wafer, the first crystalline layer, and the insulating layer are positioned in the order of the base wafer, the first crystalline layer, and the insulating layer, and the first crystalline layer is made In$_x$Ga$_{1-x}$As ($0.35 \leq x \leq 0.43$) that can pseudo-lattice-match with GaAs or AlGaAs.

The first crystalline layer is a layer usable as a channel layer of a field effect transistor, and the insulating layer is a layer usable as a gate insulating layer of the field effect transistor. The base wafer may be a wafer including at least one of GaAs and AlGaAs. The semiconductor wafer may further include a buffer layer located between the base wafer and the first crystalline layer. In this case, the buffer layer may be a layer including at least one of GaAs and AlGaAs.

The photoluminescence peak wavelength of the first crystalline layer at 77 K may be longer than 1070 nm. It is preferable that the peak wavelength of the first crystalline layer be longer than 1080 nm, and it is further preferable that the peak wavelength is longer than 1100 nm. The semiconductor wafer may further include a second crystalline layer located between the first crystalline layer and the insulating layer. In this case, the second crystalline layer is made of a Group III-V compound semiconductor having a band gap larger than that of the first crystalline layer.

The second crystalline layer may be made of In$_y$Ga$_{1-y}$P ($0<y<1$) that can pseudo-lattice-match with GaAs or AlGaAs, or may be made of Al$_z$Ga$_{1-z}$As ($0 \leq z \leq 1$) that can pseudo-lattice-match with GaAs or AlGaAs.

The semiconductor wafer may further include a spacer layer located between the second crystalline layer and the first crystalline layer. In this case, the spacer layer has a structure selected from a first structure which is a layered structure composed of a crystalline layer made of GaAs and a crystalline layer made of Al$_m$Ga$_{1-m}$As ($0<m \leq 1$), and a second structure which is a single-layer structure composed of a crystalline layer made of GaAs or a crystalline layer made of Al$_m$Ga$_{1-m}$As ($0<m \leq 1$).

The second crystalline layer may be in contact with the insulating layer. In this case, it is preferred that aluminum oxide be present in a region of the insulating layer that is in contact with the second crystalline layer.

According to the second aspect related to the present invention, an insulated gate field effect transistor includes the semiconductor wafer according to the first aspect, wherein the first crystalline layer of the semiconductor wafer is a channel layer, and the insulating layer of the semiconductor wafer is a gate insulating layer.

One example method of producing the semiconductor wafer according to the present invention is as follows. First, a growth wafer made of a high-resistance semi-insulating GaAs monocrystalline or the like is prepared. A GaAs wafer produced by Liquid Encapsulated Czochralski (LEC) method, Vertical Bridgman (VB) method, Vertical Gradient Freezing (VGF) method, etc. is preferable as the growth wafer, which however is not limited to them. Regardless of its producing method, the growth wafer should have one main surface that has an inclination of about 0.05° to 10° from one primary crystallographic plane direction.

To remove foreign matters on the surface of the growth wafer, it is possible to perform degreasing cleaning, etching, water washing, and drying on it. Then, the growth wafer is placed on a heating susceptor in a publicly-known crystal growth furnace, and heating is started. Before starting the heating, the atmosphere in the furnace may be purged by high-purity hydrogen, or the like. When the temperature of the growth wafer has stabilized at a suitable temperature, normally, an arsenic material gas is supplied into the growth furnace. For example, when growing a GaAs layer, a gallium material gas is supplied after the supply of the arsenic material gas. When growing an AlGaAs layer, a gallium material and an aluminum material are introduced in addition to the supply of an arsenic material. When growing a channel layer made of InGaAs, an indium material and a gallium material gas are supplied in addition to the supply of an arsenic material gas. When growing an electron supplying layer made of n-AlGaAs, a gallium material gas, an aluminum material gas, and an n-type dopant material gas are supplied in addition to the supply of an arsenic material gas. When growing an InGaP layer, a phosphorus material is supplied instead of an arsenic material, and an indium material, and a gallium material are supplied in addition to it.

A desired layered structure is grown by controlling a prescribed supplying time and the supplying rate of each material. Finally, the supply of each material is stopped to stop the crystalline layer growth in the way described above, and after cooled, the layered epitaxial wafer is taken out from the furnace to complete the crystal growth process. By controlling the amount of supply of each material and the time, desired compound semiconductor layers including at least a buffer layer, a channel layer made of InGaAs, an electron supply layer made of n-AlGaAs, a contact layer, etc. are grown directly or indirectly on the growth wafer sequentially.

In a more specific example producing method of the present invention, when forming a channel layer, triethylgallium is used as a gallium material gas, the temperature of a GaAs monocrystalline wafer as the growth wafer is set in a range of 450° C. or higher to 490° C. or lower, thereby an InGaAs layer is formed. The temperature of the growth wafer when growing an AlGaAs layer and an InGaP layer is about 600° C. to 675° C., and trimethylgallium is used as a gallium material gas. TMA (triethylaluminum) is used as an aluminum material gas, and TMI (trimethylindium) is used as an indium material gas.

Trihydrogenated arsenic (arsine) is used as an arsenic material gas. Trihydrogenated phosphorus (phosphine) is used as a phosphorus material gas. It is also possible to use alkyl arsine or alkyl phosphine obtained by substituting an alkyl group having one to four carbon atom(s) for hydrogen in the arsenic material gas or the phosphorus material gas.

A disilane gas is used as an n-type dopant material gas. It is also possible to use a hydride of silicon, germanium, tin, sulfur, selenium, etc., or an alkylated product of these substances that has an alkyl group having one to three carbon atom(s), as an n-type dopant material gas.

After all the layers have been grown directly or indirectly on the growth wafer in this way, the supply of each material is stopped to stop the growth, and after cooled, the layered epitaxial wafer is taken out from the growth furnace to complete the crystal growth process.

BEST MODE FOR CARRYING OUT THE INVENTION

Figure 1:
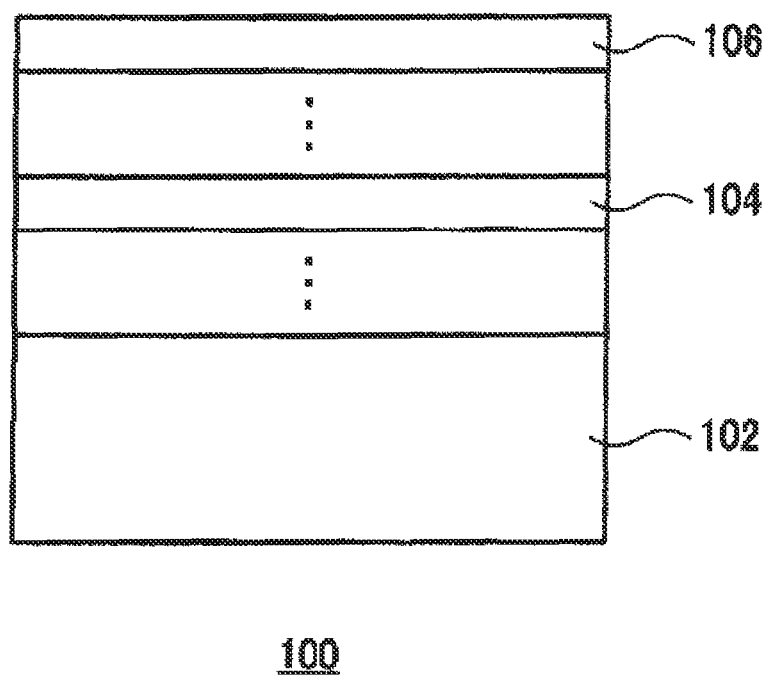
FIG. 1 shows a schematic view of a semiconductor wafer 100.

FIG. 1 shows an exemplary schematic view of a semiconductor wafer 100. The semiconductor wafer 100 includes a base wafer 102, a first crystalline layer 104, and an insulating layer 106. The base wafer 102, the first crystalline layer 104, and the insulating layer 106 are positioned in the order of the base wafer 102, the first crystalline layer 104, and the insulating layer 106. The first crystalline layer 104 can be used as a channel layer of a field effect transistor, and the insulating layer 106 can be used as a gate insulating layer of a field effect transistor.

The base wafer 102 may be made of an arbitrary material and have an arbitrary structure, as long as an epitaxial layer for a P-HEMT can be formed directly or indirectly thereon. That is, silicon, a Group III-V compound semiconductor, sapphire, etc. can be selected as the material of the base wafer 102, and a monocrystalline structure, a polycrystalline structure, or an amorphous (non-crystalline) structure can be selected as the structure of the base wafer 102. However, when InGaAs is selected as a channel layer of the P-HEMT structure and GaAs or AlGaAs is selected as a crystalline layer that forms a hetero junction with the channel layer, it is suitable to use a GaAs monocrystalline wafer as the base wafer 102.

A buffer layer may be formed between the base layer 102 and the first crystalline layer 104. When InGaAs is selected as the channel layer of the P-HEMT structure, the buffer layer may be a GaAs layer, an AlGaAs layer, or a superlattice layer of GaAs and AlGaAs.

The first crystalline layer 104 is made of $In_xGa_{1-x}As$ that can lattice-match or pseudo-lattice-match with GaAs or AlGaAs. Here, x indicates the In composition of the first crystalline layer 104, and the In composition x satisfies the condition of $0.35 \leq x \leq 0.43$. InGaAs contained in the first crystalline layer 104 lattice-matches or pseudo-lattice-matches with GaAs or AlGaAs contained in, for example, the base wafer 102 or the buffer layer described above.

When using InGaAs that lattice-matches or pseudo-lattice matches with GaAs or AlGaAs as a channel layer of a P-HEMT structure, it has conventionally been common to set the In composition x to 0.3 or less, typically to about 0.25.

In the present embodiment, by setting the In composition x to 0.35 or more, preferably to 0.36 or more, it is possible to increase the carrier mobility in the first crystalline layer 104 when the first crystalline layer 104 is used as a channel layer. Further, by increasing the In composition x, it is possible to increase the wavelength of emission from a quantum well in an InGaAs layer (first crystalline layer 104) channel, which is between the quantum level at the lower edge of the conduction band and the quantum level at the upper edge of the valence band. It is possible to maximize this emission wavelength when the In composition x=about 0.4.

It is unfavorable to set the In composition x to more than about 0.45, because at such a composition, the crystallinity of InGaAs decreases and the carrier mobility greatly decreases. Further, when the In composition x is increased, it becomes necessary to reduce the thickness of the InGaAs layer in order to maintain the pseudo-lattice-match with GaAs or AlGaAs. The first crystalline layer 104 with an increased In composition x of about 0.45 is not preferable to be used as the channel layer, because at this composition, electron affinity will not be large due to a quantum effect.

The mechanism of, by increasing the In composition x, reducing adverse effects from a MOS interface state when modulating a channel electron density of an insulated gate P-HEMT structure by a gate voltage, thereby consequently increasing the carrier mobility of the channel layer will be described later in detail.

The insulating layer 106 may be made of an arbitrary material and have an arbitrary structure as long as it can be used as a gate insulating layer of a field effect transistor. For example, the material of the insulating layer 106 may be $Al_2O_3$, $HfO_2$, $SiO_2$, $Si_3N_4$, etc., and the structure of the insulating layer 106 may be a monocrystalline structure, a polycrystalline structure, or an amorphous (non-crystalline) structure. However, in terms of reducing the effective thickness of the gate insulating layer as much as possible, a high dielectric constant material such as $Al_2O_3$, $HfO_2$, etc. is preferable for the insulating layer 106.

While the method of forming the insulating layer 106 may be vacuum evaporation, sputtering, thermal chemical vapor deposition (thermal CVD), plasma chemical vapor deposition (PCVD), catalytic chemical vapor deposition (CATCVD), MOCVD, molecular beam epitaxy (MBE), etc., atomic layer deposition (ALD) is particularly preferable in terms of reducing an interface state.

A second crystalline layer may be provided between the first crystalline layer 104 and the insulating layer 106. The second crystalline layer is made of a Group III-V compound semiconductor having a band gap larger than that of the first crystalline layer 104. The second crystalline layer may be made of $In_yGa_{1-y}P$ ($0<y<1$) that can pseudo-lattice-match with GaAs or AlGaAs, or may be made of $Al_zGa_{1-z}As$ ($0 \leq z \leq 1$) that can lattice-match or pseudo-lattice-match with GaAs or AlGaAs. InGaP or AlGaAs that constitutes the second crystalline layer lattice-matches or pseudo-lattice-matches with GaAs or AlGaAs that is contained in any of the layers formed below the second crystalline layer or in the base wafer 102. By providing the second crystalline layer, it is possible to adjust the Fermi level of the first crystalline layer 104 and reduce any influence from interface states formed at the interface between the insulating layer 106 and a semiconductor. Alternatively, the second crystalline layer may be a doped layer obtained by doping an AlGaAs layer or a GaAs layer partially with an impurity. The doped layer can function as a threshold adjusting layer that adjusts the threshold voltage of an FET with the doped impurity activated at near a room temperature to thereby have space charges.

A spacer layer may further be provided between the second crystalline layer and the first crystalline layer 104. In this case, the spacer layer may be a layered structure including a crystalline layer made of GaAs and a crystalline layer made of $Al_mGa_{1-m}As$ ($0<m \leq 1$). Alternatively, the spacer layer may be a single-layer structure including a crystalline layer made of GaAs or a crystalline layer made of $Al_mGa_{1-m}As$ ($0<m \leq 1$). A non-doped AlGaAs layer or a non-doped GaAs layer can be included as examples of the spacer layer. A spacer layer and a doped layer may be formed between the first crystalline layer 104 and the buffer layer.

The second crystalline layer may be in contact with the insulating layer 106. In this case, it is preferable that aluminum oxide be located in a region of the insulating layer 106 that is in contact with the second crystalline layer. That is, it is preferable that this region of the insulating layer 106 be made of aluminum oxide. By making this region with aluminum oxide, it is possible to reduce the density of interface states formed at the interface between the insulating layer 106 and the second crystalline layer.

Figure 2:
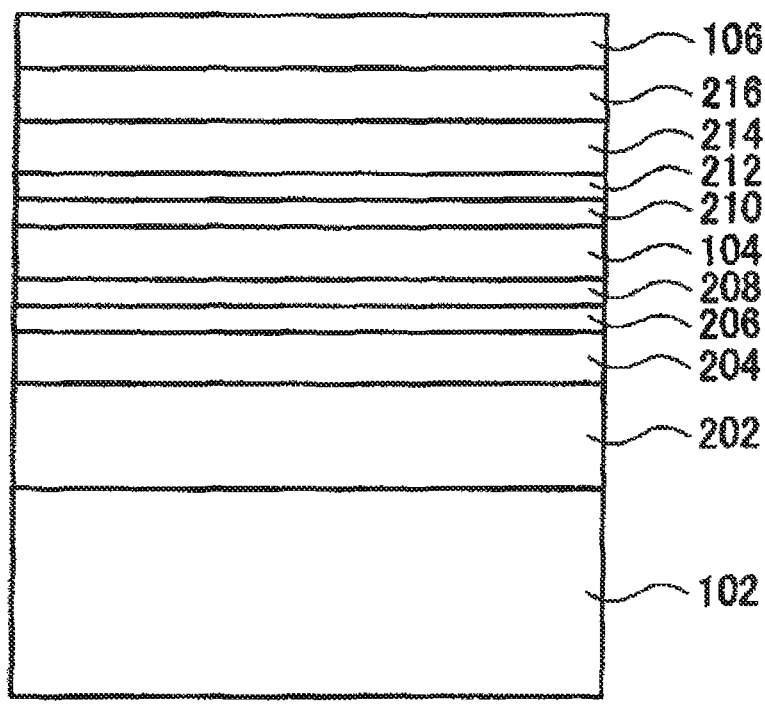
FIG. 2 shows a schematic view of a semiconductor wafer 200.

FIG. 2 shows a schematic view of a semiconductor wafer 200. The semiconductor wafer 200 can be used for production of an insulated gate field effect transistor. The semiconductor wafer 200 includes, directly or indirectly on a base wafer 102, a buffer layer 202, a doped layer 204, a first spacer layer 206, a second spacer layer 208, a first crystalline layer 104, a third spacer layer 210, a fourth spacer layer 212, a doped layer 214, a non-doped layer 216, and an insulating layer 106, in this order.

The base wafer 102 may be, for example, a GaAs monocrystalline wafer. The buffer layer 202 may be a layered film having a total thickness of about 800 nm which is obtained by stacking a non-doped AlGaAs layer and a non-doped GaAs layer. The doped layer 204 may be, for example, an n-type AlGaAs layer doped with an n-type dopant. The n-type dopant may be a Si atom. By adjusting the thickness and the impurity concentration (dopant concentration) of the doped layer 204, it is possible to adjust the threshold voltage of an FET.

The first spacer layer 206 and the fourth spacer layer 212 may be, for example, a non-doped AlGaAs layer. The second spacer layer 208 and the third spacer layer 210 may be, for example, a non-doped GaAs layer. The first crystalline layer 104 may be, for example, a non-doped $In_xGa_{1-x}As$ layer ($0.35 \leq x \leq 0.43$), and preferably a non-doped $In_xGa_{1-x}As$ layer ($0.36 \leq x \leq 0.43$). The thickness of the first crystalline layer 104 is adjusted according to the In composition x. The thickness of the first crystalline layer 104 is preferably 10 nm or smaller, and it is good if the thickness is 7 nm or smaller and 4 nm or larger.

The first spacer layer 206, the second spacer layer 208, the third spacer layer 210, and the fourth spacer layer 212 contribute to maintaining the mobility of carriers migrating through the first crystalline layer 104 high. However, the thickness of each of the first spacer layer 206, the second spacer layer 208, the third spacer layer 210, and the fourth spacer layer 212 should be adjusted to 10 nm or smaller, because the density of the carriers confined in the first crystalline layer 104 is made lower if the first spacer layer 206, the second spacer layer 208, the third spacer layer 210, and the fourth spacer layer 212 are too thick. Some or all of the first spacer layer 206, the second spacer layer 208, the third spacer layer 210, and the fourth spacer layer 212 can be removed, depending on the performance level required of the transistor.

The doped layer 214 may be, for example, an n-type AlGaAs layer doped with an n-type dopant. The n-type dopant may be a Si atom. By adjusting the thickness and the impurity concentration of the doped layer 214, it is possible to adjust the threshold voltage of the FET. The thicknesses and the impurity concentrations of the doped layer 204 and the doped layer 214 are adjusted in view of each other. Either one or both of the doped layer 204 and the doped layer 214 may be removed, according to the design goal of the FET.

The non-doped layer 216 may be, for example, a non-doped AlGaAs layer. The non-doped layer 216 may be removed in relation with the fourth spacer layer 212 and the doped layer 214. The non-doped layer 216 may be made of $In_yGa_{1-y}P$ ($0<y<1$) that can pseudo-lattice-match with GaAs or AlGaAs. Alternatively, the non-doped layer 216 may be made of $Al_zGa_{1-z}As$ ($0 \leq z \leq 1$) that can lattice-match or pseudo-lattice-match with GaAs or AlGaAs. With the non-doped layer 216, it is possible to reduce any influence from interface states formed at the interface with the insulating layer 106. The insulating layer 106 may be, for example, an $Al_2O_3$ layer formed by ALD method.

The distance between the first crystalline layer 104 functioning as the channel layer of the FET and the insulating layer 106 determining the gate electrode of the FET is a parameter relevant to the transconductance of the FET, and the transconductance increases as the distance decreases. A thinner total thickness of the layers from the third spacer layer 210 to the insulating layer 106 may make the transconductance higher, but the thickness is suitably adjusted in comprehensive consideration of a gate leakage current, adjustment and controllability of the threshold voltage, reduction of the carrier mobility, etc.

The buffer layer 202, the doped layer 204, the first spacer layer 206, the second spacer layer 208, the first crystalline layer 104, the third spacer layer 210, the fourth spacer layer 212, the doped layer 214, and the non-doped layer 216 can be formed by MOCVD method. The insulating layer 106 can be formed by ALD method. In this way, the semiconductor wafer 200 can be produced.

Figure 3:
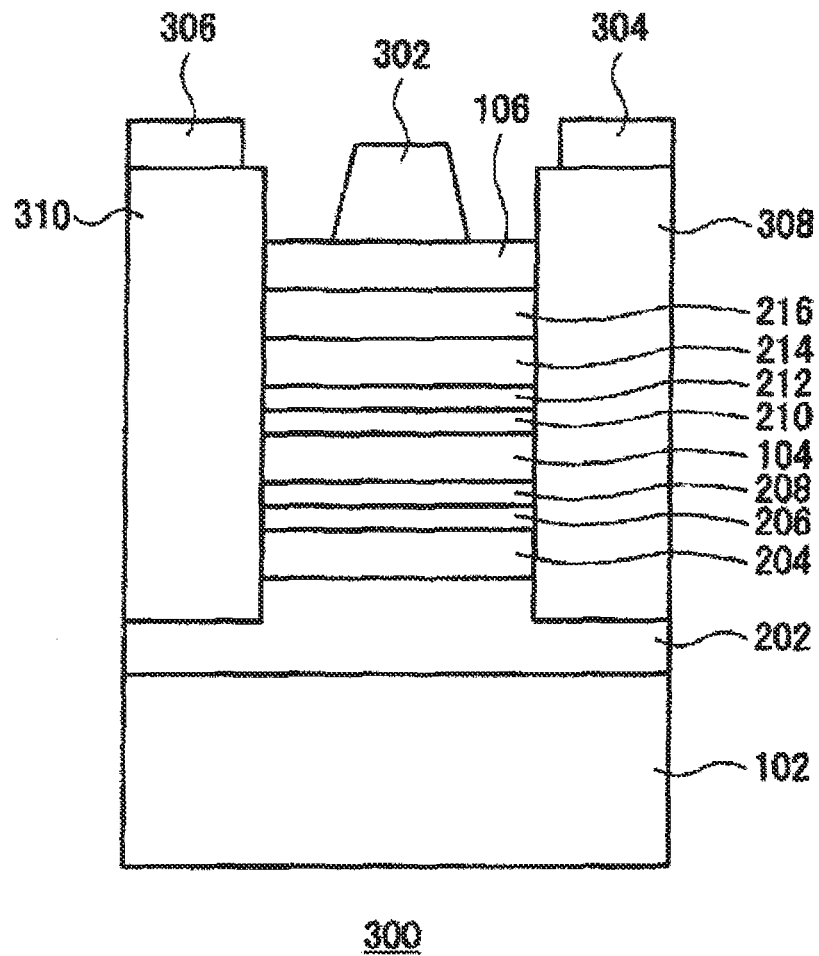
FIG. 3 shows a schematic view of an insulated gate field effect transistor 300.

FIG. 3 shows a schematic view of an insulated gate field effect transistor 300. The insulated gate field effect transistor 300 can be produced by using the semiconductor wafer 200. A gate electrode 302 is formed directly or indirectly on the insulating layer 106, and a source electrode 304 and a drain electrode 306 are formed sandwiching the gate electrode 302 therebetween. The regions of the insulating layer 106 where the source electrode 304 and the drain electrode 306 are formed are removed so as to electrically connect the source electrode 304 and the drain electrode 306 to the channel below the gate electrode 302.

A contact region 308 and a contact region 310 are formed below the source electrode 304 and the drain electrode 306 respectively, in order to reduce the contact resistance. The contact region 308 and the contact region 310 can be formed by, for example, performing ion implantation of an impurity, and after this, activating the implanted impurity by a thermal treatment. When producing an insulated gate field effect transistor functioning as an N-channel type, an n-type dopant is implanted as the impurity. The n-type dopant may be, for example, a Si atom.

In another manner of forming the contact region 308 and the contact region 310, portions of the crystalline layers that are located where the contact region 308 and the contact region 310 are to be formed are removed by etching, and a conductive crystalline layer is re-grown where the removed portions have been. When producing an insulated gate field effect transistor functioning as an N-channel type, the conductive crystalline layer may be, for example, n-type $In_zGa_{1-z}As$ ($0 \leq z \leq 1$) or n-type $Si_yGe_{1-y}$ ($0 \leq y \leq 1$). The method for re-growing the crystalline layer may be, for example, metal organic chemical vapor deposition (MOCVD), or CVD using an $SiH_4$ gas and $GeH_4$ gas as material gases.

Figure 4:
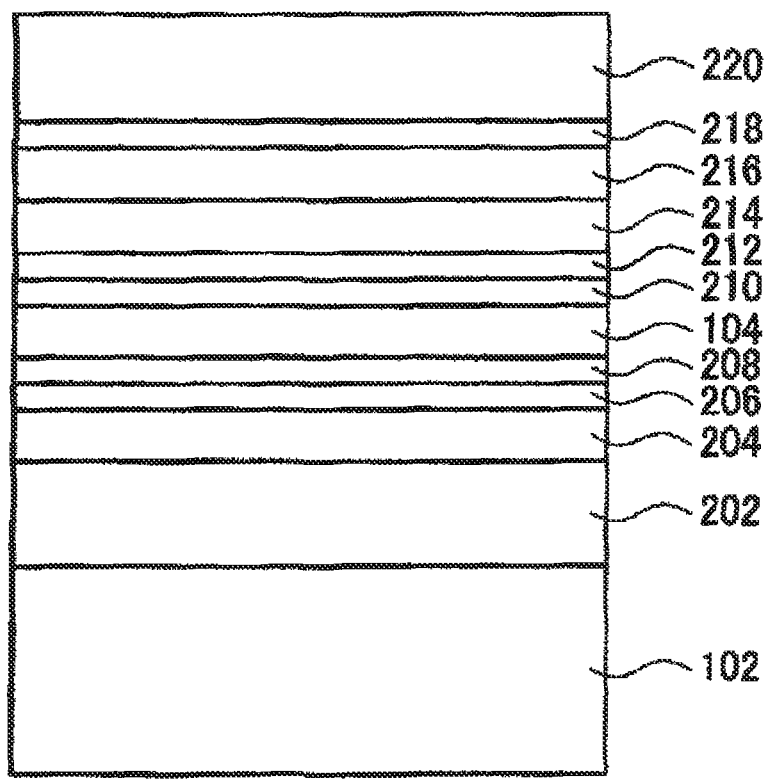
FIG. 4 shows a schematic view of a semiconductor wafer 400.

FIG. 4 shows a schematic view of a semiconductor wafer 400. The semiconductor wafer 400 can be used for producing an insulated gate field effect transistor. The semiconductor wafer 400 includes, directly or indirectly on a base wafer 102, a buffer layer 202, a doped layer 204, a first spacer layer 206, a second spacer layer 208, a first crystalline layer 104, a third spacer layer 210, a fourth spacer layer 212, a doped layer 214, a non-doped layer 216, an etching stopper layer 218, and a contact layer 220, in this order. The base wafer 102, the buffer layer 202, the doped layer 204, the first spacer layer 206, the second spacer layer 208, the first crystalline layer 104, the third spacer layer 210, the fourth spacer layer 212, the doped layer 214, and the non-doped layer 216 are the same as in FIG. 2.

The etching stopper layer 218 may be, for example, an $In_{0.48}Ga_{0.52}P$ layer. The $In_{0.48}Ga_{0.52}P$ layer can be formed to a thickness of about 10 nm. The etching stopper layer 218 can be doped with an impurity atom according to the channel type of the insulated gate field effect transistor. By doping the etching stopper layer 218 with an impurity atom, it is possible to suppress a resistance increase caused by the etching stopper layer 218 due to a potential barrier of a hetero junction. When producing an insulated gate field effect transistor functioning as an N-channel type, the etching stopper layer 218 is doped with an n-type dopant as the impurity atom. The n-type dopant may be, for example, a Si atom. The dose (impurity concentration) of the Si atom can be adjusted to be about $3 \times 10^{18}$ cm$^{-3}$.

The contact layer 220 may be, for example, a GaAs layer. The GaAs layer can be formed to a thickness of about 100 nm. The contact layer 220 is doped with an impurity atom according to the channel type of the insulated gate field effect transistor. When producing an insulated gate field effect transistor functioning as an N-channel type, the contact layer 220 is doped with an n-type dopant as the impurity atom. The n-type dopant may be, for example, a Si atom. The dose (impurity concentration) of the Si atom can be adjusted to be about $5 \times 10^{18}$ cm$^{-3}$.

Figure 5:
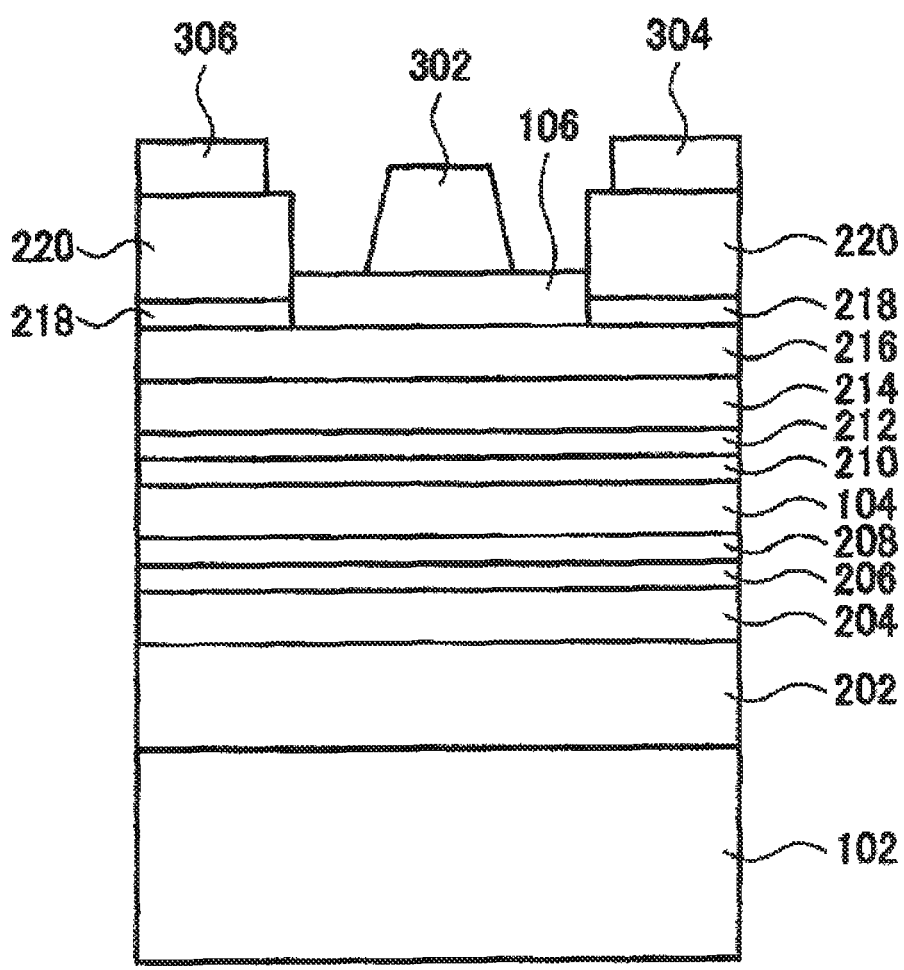
FIG. 5 shows a schematic view of an insulated gate field effect transistor 500.

FIG. 5 shows a schematic view of an insulated gate field effect transistor 500. The insulated gate field effect transistor 500 can be produced from the semiconductor wafer 400 shown in FIG. 4. The insulated gate field effect transistor 500 includes an insulating layer 106 directly or indirectly on a non-doped layer 216, and a gate electrode 302 directly or indirectly on the insulating layer 106. A source electrode 304 and a drain electrode 306 are formed on the contact layer 220 sandwiching the gate electrode 302 therebetween.

The insulated gate field effect transistor 500 can be produced as follows. The regions (gate electrode forming regions) of the contact layer 220 and the etching stopper layer 218 where the gate electrode 302 is to be formed are removed by etching. In the etching, the etching stopper layer 218 is used as the etching stopper, allowing an accurate depth etching. After this, the insulating layer 106 is formed all over the surface. The gate electrode 302 is formed directly or indirectly on the insulating layer 106 within the gate electrode forming region. The regions of the insulating layer 106 where the source electrode 304 and the drain electrode 306 are to be formed are removed, and the source electrode 304 and the drain electrode 306 are formed sandwiching the gate electrode 302 therebetween. Each of the source electrode 304 and the drain electrode 306 is formed so as to be electrically connected to the channel below the gate electrode 302. The gate electrode 302 may be, for example, a layered film made of Ti/Pt/Au. A layered film of Ti/Pt/Au can be formed by vacuum evaporation. The source electrode 304 and the drain electrode 306 may be a layered film made of AuGe/Ni/Au. A layered film of AuGe/Ni/Au can be formed by vacuum evaporation. The gate electrode 302, the source electrode 304, and the drain electrode 306 can be formed by patterning using lift-off technique.

EXAMPLES

The semiconductor wafer 400 shown in FIG. 4 was produced. A GaAs monocrystalline wafer was used as the base wafer 102. A non-doped Al$_{0.25}$Ga$_{0.75}$As layer and a non-doped GaAs layer to be the buffer layer 202 were formed directly or indirectly on the base wafer 102 in a total thickness of the layers of 800 nm. An n-type Al$_{0.24}$Ga$_{0.76}$As layer to be the doped layer 204 was formed directly or indirectly on the buffer layer 202 to a thickness of 5 nm. A Si atom was used as the n-type dopant, and the impurity concentration was adjusted to $2.31 \times 10^{18}$ cm$^{-3}$. A non-doped Al$_{0.24}$Ga$_{0.76}$As layer to be the first spacer layer 206 was formed directly or indirectly on the doped layer 204 to a thickness of 4 nm. A non-doped GaAs layer to be the second spacer layer 208 was formed directly or indirectly on the first spacer layer 206 to a thickness of 6 nm.

A non-doped In$_{0.4}$Ga$_{0.6}$As layer to be the first crystalline layer 104 was formed directly or indirectly on the second spacer layer 208 to a thickness of 5.5 nm. A non-doped GaAs layer to be the third spacer layer 210 was formed directly or indirectly on the first crystalline layer 104 to a thickness of 6 nm. A non-doped Al$_{0.24}$Ga$_{0.76}$As layer to be the fourth spacer layer 212 was formed directly or indirectly on the third spacer layer 210 to a thickness of 4 nm. An n-type Al$_{0.24}$Ga$_{0.76}$As layer to be the doped layer 214 was formed directly or indirectly on the fourth spacer layer 212 to a thickness of 10 nm. A Si atom was used as the n-type dopant, and the impurity concentration was adjusted to $3 \times 10^{18}$ cm$^{-3}$. A non-doped Al$_{0.24}$Ga$_{0.76}$As layer to be the non-doped layer 216 was formed directly or indirectly on the doped layer 214 to a thickness of 10 nm.

An n-type In$_{0.24}$Ga$_{0.76}$P layer to be the etching stopper layer 218 was formed directly or indirectly on the non-doped layer 216 to a thickness of 10 nm. A Si atom was used as the n-type dopant, and the impurity concentration was adjusted to $3 \times 10^{18}$ cm$^{-3}$. Finally, an n-type GaAs layer to be the contact layer 220 was formed directly or indirectly on the etching stopper layer 218 to a thickness of 100 nm. A Si atom was used as the n-type dopant, and the impurity concentration was adjusted to $5 \times 10^{18}$ cm$^{-3}$.

The AlGaAs layers, the InGaAs layer, the GaAs layers, and the InGaP layer were formed by MOCVD method. TMA (trimethylaluminum), TMI (trimethylindium), TMG (trimethylgallium), TEG (triethylgallium), and arsine (AsH$_3$) were used as the material gases for an Al atom, an In atom, a Ga atom, and an As atom, respectively. Phosphine (PH$_3$) was used as the material gas for a P atom. Disilane (Si$_2$H$_6$) was used as the material gas for an Si atom. In this way, the semiconductor wafer 400 was produced.

The insulated gate field effect transistor 500 shown in FIG. 5 was made as a prototype. The insulated gate field effect transistor 500 was made from the semiconductor wafer 400 shown in FIG. 4. The regions (gate electrode forming regions) of the contact layer 220 and the etching stopper layer 218 where the gate electrode 302 was to be formed were removed by etching. After this, an Al$_2$O$_3$ layer to be the insulating layer 106 was formed all over the surface to a thickness of 12 nm. The Al$_2$O$_3$ layer was formed by ALD method. The gate electrode 302 was formed directly or indirectly on the insulating layer 106 within the gate electrode forming region. The regions of the insulating layer 106 where the source electrode 304 and the drain electrode 306 were to be formed were removed, and the source electrode 304 and the drain electrode 306 were formed. The source electrode 304 and the drain electrode 306 were formed so as to sandwich the gate electrode 302 therebetween for each of them to be electrically connected to the channel below the gate electrode 302. The gate electrode 302 was formed by forming a layered film of Ti/Pt/Au by vacuum evaporation and patterned using lift-off technique. The source electrode 304 and the drain electrode 306 were formed by forming a layered film of AuGe/Ni/Au by vacuum evaporation and patterned using lift-off technique.

Two channels might be formed through the insulated gate field effect transistor 500 depending on the gate voltage. One is a first channel formed in the non-doped In$_{0.4}$Ga$_{0.6}$As layer, which is the first crystalline layer 104. The other one is a second channel formed in the non-doped Al$_{0.24}$Ga$_{0.76}$As layer, which is the non-doped layer 216.

Figure 6:
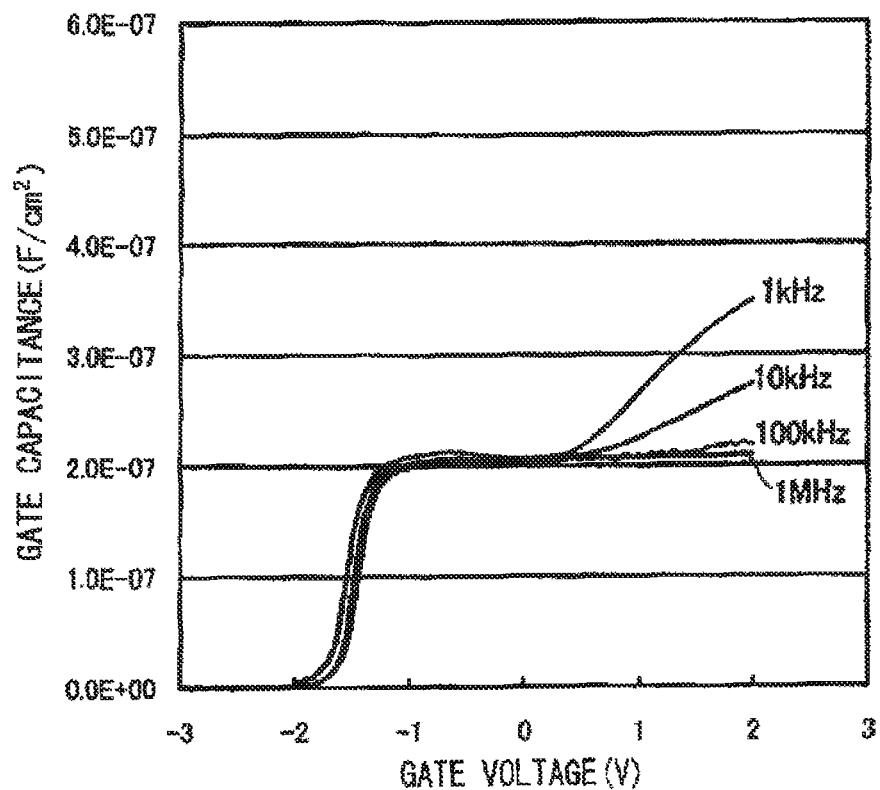
FIG. 6 is a plot of gate capacitance vs. gate voltage profiles (C-V characteristics) of the insulated gate field effect transistor 500, which were obtained from an experiment.

FIG. 6 is a plot of gate capacitance vs. gate voltage (C-V characteristics) of the insulated gate field effect transistor 500, which were obtained from an experiment. Shown are four C-V characteristics at measuring frequencies of 1 kHz, 10 kHz, 100 kHz, and 1 MHz. Up to a gate voltage lower than about 0.5 V, serious dispersion depending on the measuring frequencies (frequency dispersion) was not observed in the C-V characteristics, indicating that the carrier density may be modulated well by the gate voltage. However, it can be seen that above a gate voltage of about 0.5 V, frequency dispersion occurred, and at the measuring frequencies higher than 100 kHz, the carrier density could no longer be modulated by changing the gate voltage.

Figure 7:
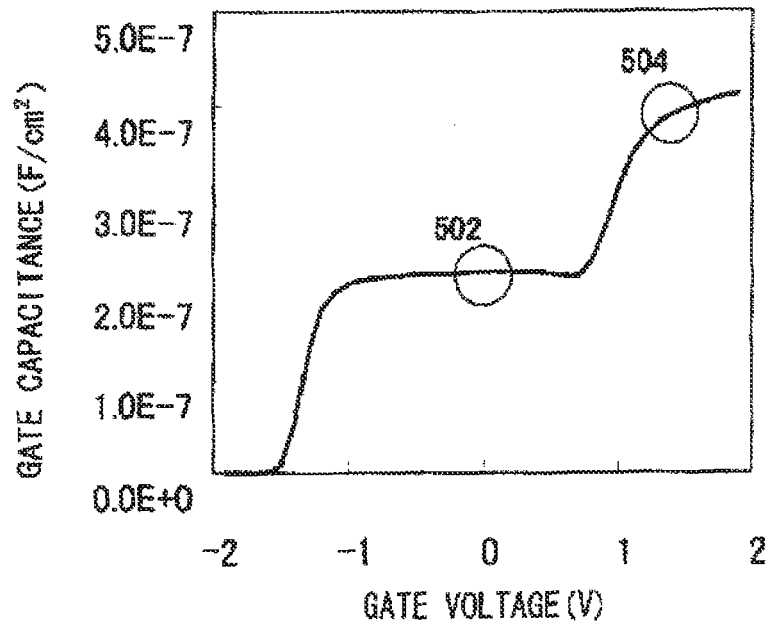
FIG. 7 shows a simulated C-V characteristic of the insulated gate field effect transistor 500 on condition that it has an ideal MOS interface where no interface state exists.

On the other hand, FIG. 7 shows a simulated C-V characteristic of the insulated gate field effect transistor 500 on condition that it has an ideal MOS interface where no interface state exists. Note that the thickness of the n-type $Al_{0.24}Ga_{0.76}As$ layer which is the doped layer 204 was set to 5 nm, a Si atom was used as the n-type dopant, and the impurity concentration was set to $2.30 \times 10^{18}$ cm$^{-3}$. The thickness of the non-doped $Al_{0.24}Ga_{0.76}As$ layer which is the first spacer layer 206 was set to 2 nm. The thickness of the non-doped GaAs layer which is the second spacer layer 208 was set to 3 nm. The thickness of the non-doped $In_{0.4}Ga_{0.6}As$ layer which is the first crystalline layer 104 was set to 5.5 nm. The thickness of the non-doped GaAs layer which is the third spacer layer 210 was set to 3 nm. The thickness of the non-doped $Al_{0.24}Ga_{0.76}As$ layer which is the fourth spacer layer 212 was set to 2 nm. The thickness of the n-type $Al_{0.24}Ga_{0.76}As$ layer which is the doped layer 214 was set to 6 nm, a Si atom was used as the n-type dopant, and the impurity concentration was set to $3 \times 10^{18}$ cm$^{-3}$. The thickness of the non-doped $Al_{0.24}Ga_{0.76}As$ layer which is the non-doped layer 216 was set to 14 nm. The bandgap energy of the $Al_2O_3$ layer which is the insulating layer 106 was set to 6.0 eV, and the relative permittivity thereof was set to 7. The work function of the gate electrode 302 was set to 4.83 eV. The energy level of approximately mid-gap at the interface between the base wafer 102 (a GaAs monocrystalline wafer) and the buffer layer 202 (a layered structure of a non-doped $Al_{0.25}Ga_{0.75}As$ layer and a non-doped GaAs layer) was pinned to 0 V. One-dimensional Schrodinger-Poisson method was used as the simulator. In other words, wave function was described as a Schrodinger equation, carrier density was described based on a Fermi-Dirac statistics, and band potential was described as a Poisson equation, which were solved self-contradictorily to obtain a band potential profile and a carrier density profile.

Comparing the experiment data shown in FIG. 6 with the simulated results shown in FIG. 7, it can be seen that up to a gate voltage lower than about 0.5 V, the experiment data and the simulated results are very similar, but above a gate voltage of about 0.5 V, the experiment data and the simulated results are not similar.

Figure 8:
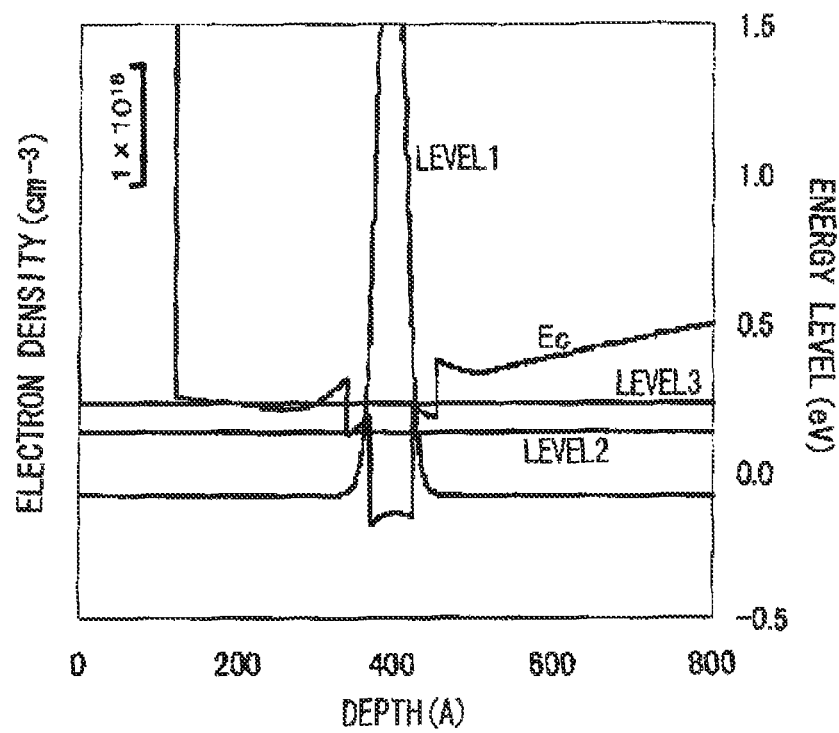
FIG. 8 is a plot of simulated results of electron density vs. depth profiles, showing a case where a gate voltage is 0 V.
Figure 9:
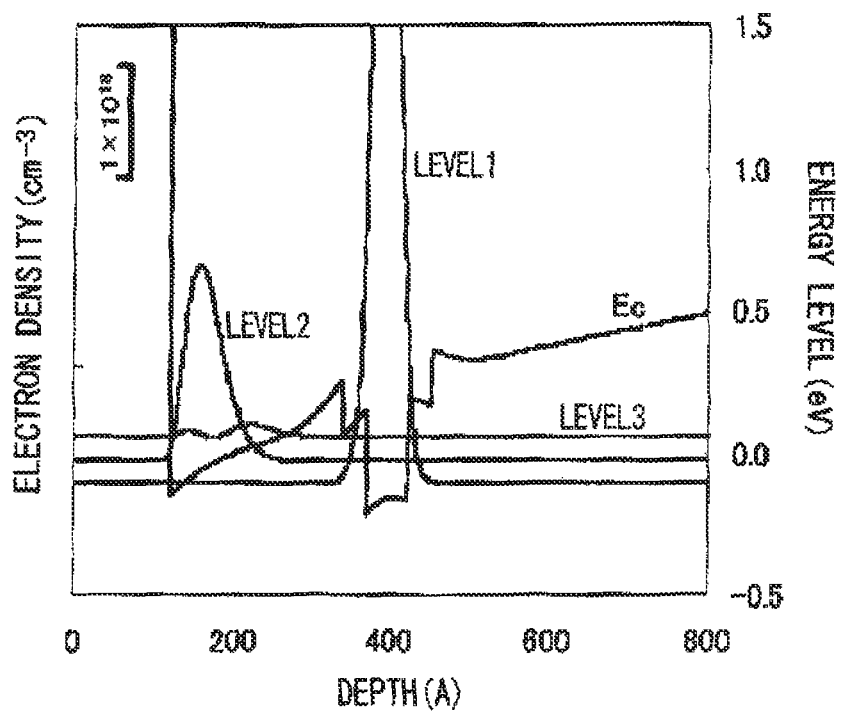
FIG. 9 is a plot of simulated results of electron density vs. depth profiles, showing a case where a gate voltage is +1.2 V.

FIG. 8 and FIG. 9 are plots of simulated results of electron density vs. depth profiles (electron density profiles) at three quantum levels, where FIG. 8 shows a case where the gate voltage is 0 V, and FIG. 9 shows a case where the gate voltage is +1.4 V. FIG. 8 and FIG. 9 also show an energy level of the lower edge of the conduction band (Ec) vs. depth, simultaneously. The baselines of the electron density profiles at the respective three quantum levels, i.e., a level 1, a level 2, and a level 3 indicate that the electron density is 0, and also indicate the energy level of each level. The length of a unit scale ($1 \times 10^{18}$ cm$^{-3}$) of the electron density is indicated by the scale-bar on the upper left of the plots. Energy levels can be read on the scale on the right-hand vertical axis. The scale of the right-hand vertical axis indicates energy level with respect to a Fermi level, and its unit is electron energy (eV).

The level 1 is the lowest energy level, and the energy levels rise in the order of the level 2 to the level 3. In FIG. 8 and FIG. 9, the depths from 0 to 120 angstrom correspond to the insulating layer 106, the depths from 120 to 260 angstrom correspond to the non-doped layer 216, the depths from 260 to 320 angstrom correspond to the doped layer 214, the depths from 320 to 370 angstrom correspond to the fourth spacer layer 212 and the third spacer layer 210, the depths from 370 to 425 angstrom correspond to the first crystalline layer 104, the depths from 425 to 475 angstrom correspond to the second spacer layer 208 and the first spacer layer 206, the depths from 475 to 525 angstrom correspond to the doped layer 204, and the depths below 525 angstrom correspond to the buffer layer 202.

Referring to FIG. 8, it can be seen that when the gate voltage is 0 V, free electrons at the level 1 are accumulated in the first crystalline layer 104 (first channel) at the depths from 370 to 425 angstrom. On the other hand, no increase is observed in the densities of free electrons at the level 2 and the level 3.

Referring to FIG. 9, it can be seen that when the gate electrode is 1.4 V, free electrons at the level 1 are accumulated in the first crystalline layer 104 (first channel) and free electrons at the level 2 are accumulated in the non-doped layer 216 (second channel) at the depths from 120 to 260 angstrom.

Figure 10:
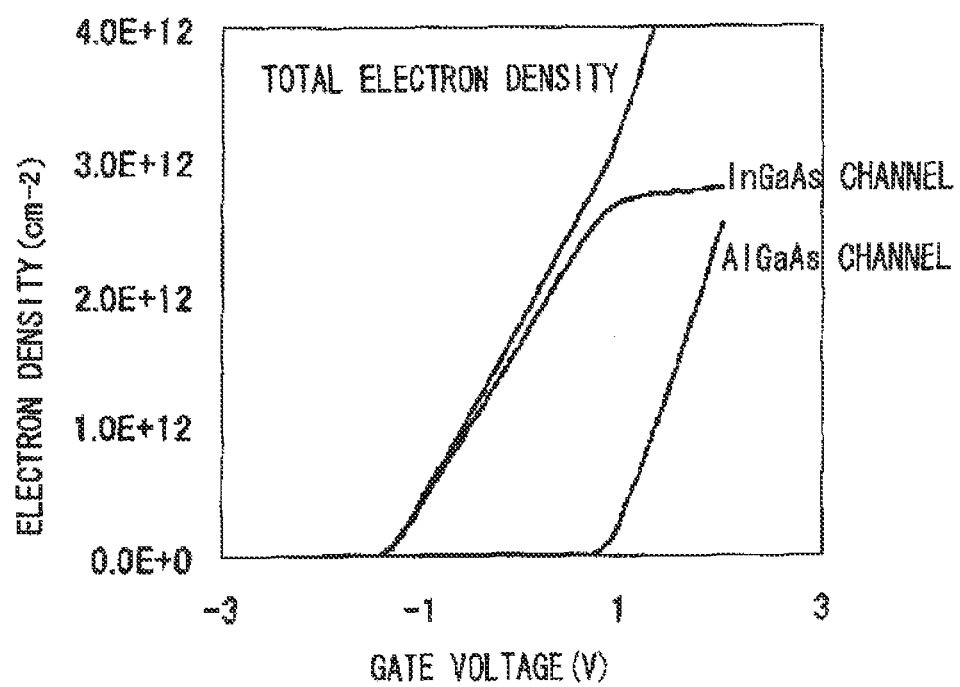
FIG. 10 is a plot of simulated results of electron density or each quantum level vs. gate voltage.

FIG. 10 is a plot of simulated results of electron density of each quantum level vs. gate voltage, as regards the first channel (labeled in the plot as "InGaAs channel") and the second channel (labeled in the plot as "AlGaAs channel"). As the gate voltage increases from about −1.3 V, the electron density of the first channel (InGaAs channel) increases. When the gate voltage becomes about 0.5 V, the electron density of the first channel (InGaAs channel) gets saturated and at the same time the electron density or the second channel (AlGaAs channel) starts to increase. The total electron density increases monotonously as the gate voltage increases.

The following model can be considered from the simulated results shown in FIG. 7 to FIG. 10. That is, as the gate voltage increases, free electrons first start to be accumulated in the first channel (the first crystalline layer 104), and the density of free electrons in the first channel (the first crystalline layer 104) increases until the gate voltage becomes about 0.5 V (the state indicated by a circle 502 in the C-V characteristic of FIG. 7). As the gate voltage further increases beyond about 0.5 V, free electrons start to be accumulated also in the second channel (the non-doped layer 216) (the state indicated by a circle 504 in the C-V characteristic of FIG. 7). Interpreting the C-V characteristics (actually measured values) shown in FIG. 6 based on this model, it can be said that in the state where the gate voltage was lower than about 0.5 V and carriers were accumulated in the first channel (the first crystalline layer 104), frequency dispersions were small and carriers were modulated properly by the gate voltage. In the state where the gate voltage was higher than about 0.5 V and carriers were accumulated both in the first channel (the first crystalline layer 104) and in the second channel (the non-doped layer 216), large frequency dispersions and a typical pinning property where the interface state density is high were shown, and therefore it can be said that the carriers could not be modulated properly by the gate voltage. In other words, it can be said that the failure in the carrier modulation is attributable to the carrier accumulation in the non-doped layer 216.

The inventor considers to be as follows the reason why the carrier modulation in the first crystalline layer 104 (InGaAs layer) which is the first channel is fine whereas the carrier modulation in the non-doped layer 216 (AlGaAs layer) which is the second channel is not fine.

Figures 11A, 11B:
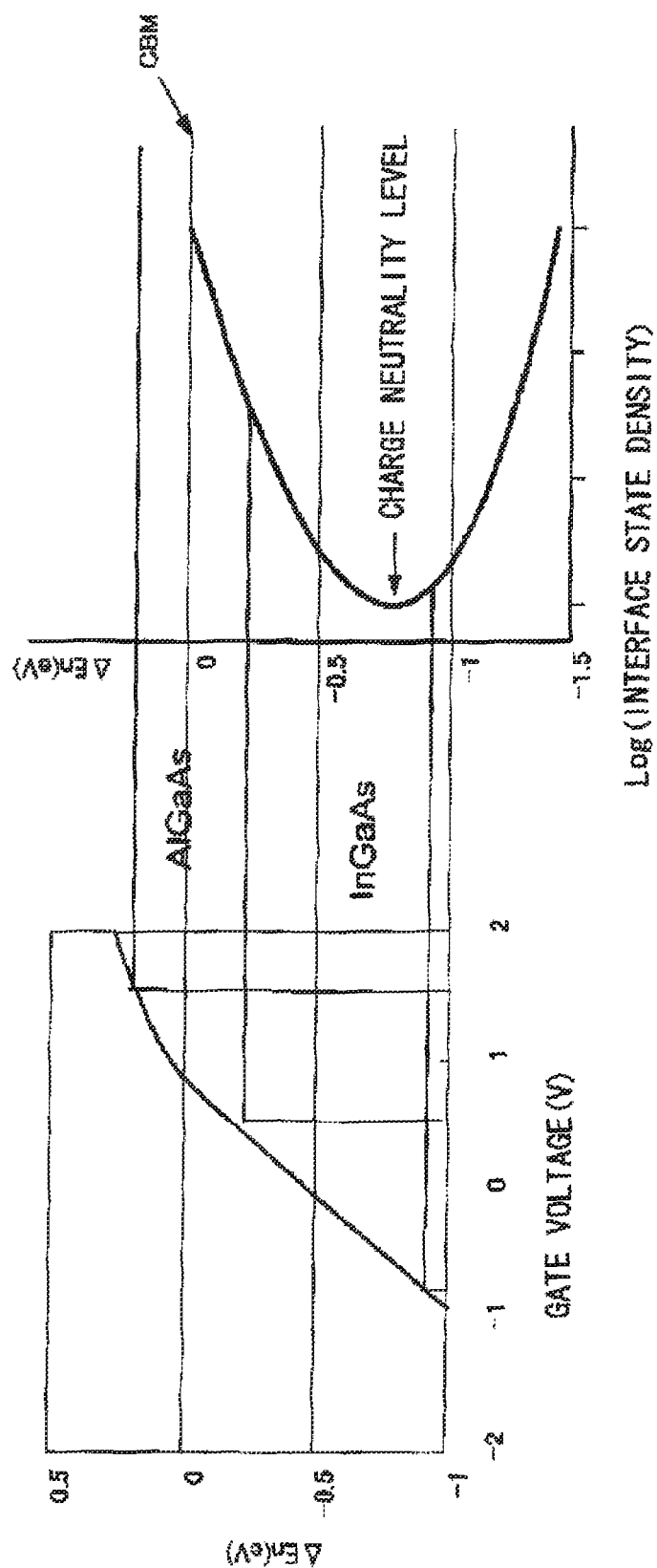
FIG. 11A is a plot of calculated value of Fermi level energies at a MOS interface with respect to changes of gate voltage.
FIG. 11B is a schematic diagram showing an exemplary relationship between interface state density and energy level in the case of GaAs.

FIG. 11A is a plot of calculated values or Fermi level at a MOS interface vs. gate voltage. Here, the MOS interface is the interface between the non-doped layer 216 and the insulating layer 106. The vertical axis of FIG. 11A indicates energy difference from the lower edge of the conduction band as ΔEn (eV). A lower gate voltage makes the Fermi level at the MOS interface lower. On the other hand, FIG. 11B shows a schematic diagram of an exemplary relationship between interface state density and energy level in the case of GaAs. The vertical axis of FIG. 11B indicates energy difference from the lower edge of the conduction band as ΔEn (eV), and the horizontal axis thereof indicates interface state density on a logarithmic scale (arbitrary value). Generally, the interface state density lowers as the energy becomes closer to the charge neutrality level, at which level the interface state density becomes the lowest. The "charge neutrality level" is usually a level within the band gap of a semiconductor, which is a boundary energy level located between a donor-like state near the upper edge of the valence band and an acceptor-like state near the lower edge of the conduction band, at which the characteristics of the valence band and the characteristics of the conduction band are neutralized.

FIG. 11A and FIG. 11B are positioned such that the scales of the vertical axes and the levels of the lower edge of the conduction band can coincide with each other. The range of the gate voltage when modulating carriers in the first crystalline layer 104 (InGaAs layer) is the range indicated by "InGaAs" in FIG. 11A, and the range of the gate voltage when modulating carriers in the non-doped layer 216 (AlGaAs layer) is the range indicated by "AlGaAs" in FIG. 11A. The ΔEn values (Fermi level at the MOS interface with respect to the lower edge of the conduction band) corresponding to the range indicated by "InGaAs" are closer to the charge neutrality level than the ΔEn values corresponding to the range indicated by "AlGaAs", and have lower interface state density. That is, the channel modulation in the first crystalline layer 104 is performed under less influence from the interface states than that under which the channel modulation is performed in the non-doped layer 216, and it can be said that the reason why carriers are modulated better in the first crystalline layer 104 than in the non-doped layer 216 is because the carrier modulation is performed in a range where the Fermi level at the MOS interface has come closer to the charge neutrality level.

The inventor has accomplished the present invention based on the above knowledge. As the In composition of an InGaAs layer is increased, the bandgap Eg becomes smaller. Hence, in an operation of an FET of which channel layer is made of InGaAs, it is possible to bring the Fermi level at the MOS interface closer to the charge neutrality level by increasing the In composition of the InGaAs layer more. Hence, as the In composition of InGaAs layer is increased, the influence from interface states is decreased, enabling the transistor to perform MOS operations better.

That being said, it is primarily important to produce a gate insulating film with a low interface state density in order to improve the MOS operations of a transistor, but it is difficult to eliminate interface states completely. Particularly, an interface state density at the tail state at approximately a band edge is enormously higher than an interface state density at approximately the charge neutrality level, and cannot be ignored. Hence, as a further measure in addition to the technology for forming a MOS interface with a low interface state density, it is extremely important to prepare a technology for reducing any influence from interface states that are present, in order to put MOS type P-HEMTs into practical use.

Figure 12:
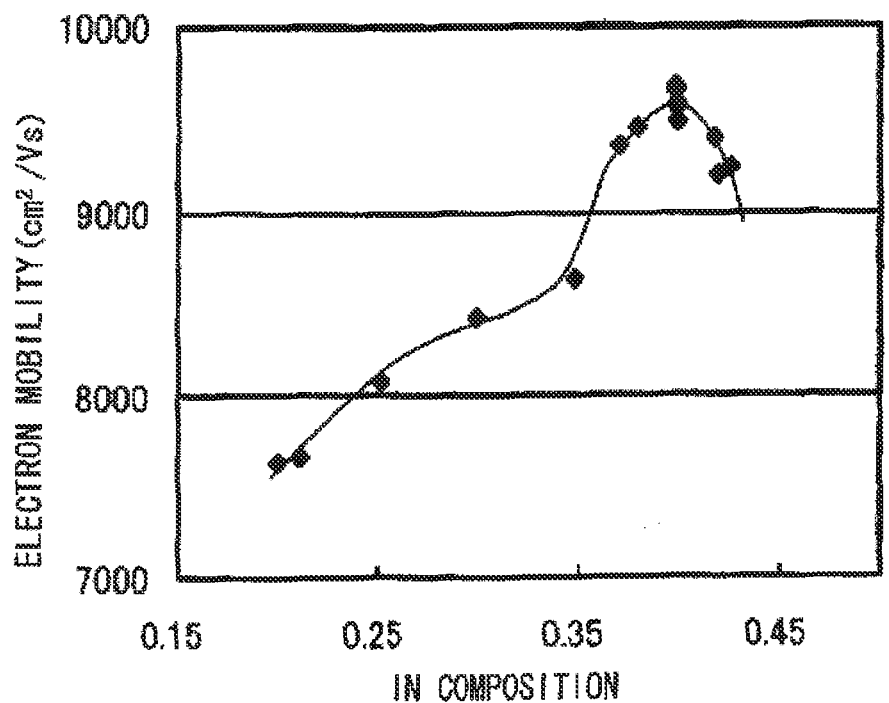
FIG. 12 is a plot showing Hall mobilities of electron measured (by Van der Pauw method) with respect to changes of In composition of a first crystalline layer 104.

FIG. 12 is a plot showing the results of an experiment of Hall mobility of electron measured (by Van der Pauw method) with respect to changes of In composition of the first crystalline layer 104. In the range of the In composition from 0.35 to 0.43, favorable results were obtained that the electron mobility was 9000 ($cm^2$/Vs) or higher. At the In composition of 0.45, the electron mobility greatly lowered to 5500 ($cm^2$/Vs). This can be considered due to increased lattice mismatch caused by too much In composition, which degenerated the crystallinity of the first crystalline layer 104.

Figure 13:
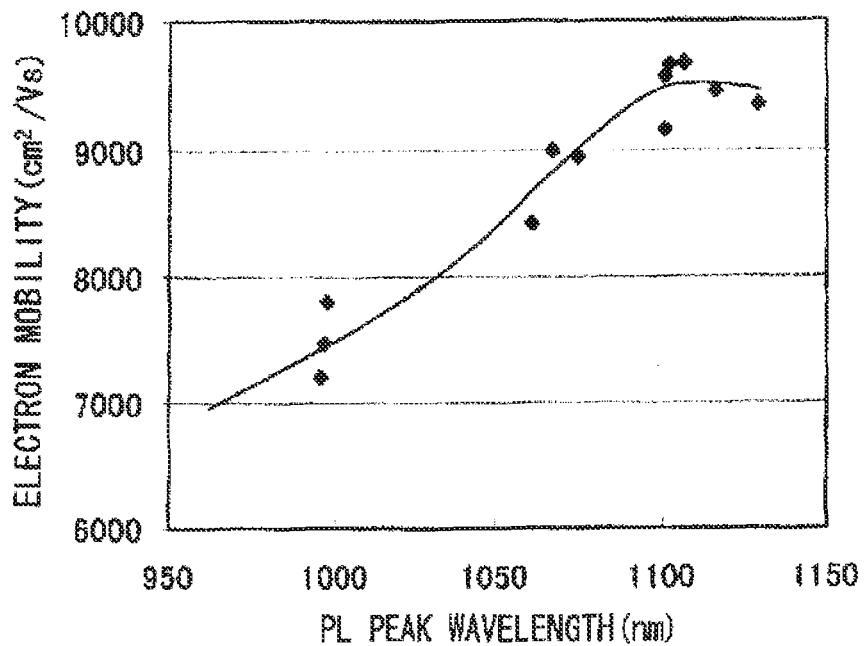
FIG. 13 is a plot of Hall mobility of electron measured at a room temperature vs. photoluminescence peak wavelength at 77 K of the first crystalline layer 104.

FIG. 13 is a plot of electron mobility measured at a room temperature vs. photoluminescence peak wavelength measured at 77K of the first crystalline layer 104. A strong correlation was observed between the electron mobility and the peak wavelength. At the peak wavelengths longer than 1070 nm, the electron mobilities were 9000 ($cm^2$/Vs) or higher. The photoluminescence peak wavelength corresponds to the energy between the ground levels of a quantum well formed in the first crystalline layer 104. In other words, a quantum level formed in the conduction band corresponds to a state that the longer the photoluminescence peak wavelength, the higher the electron affinity, which means that in the MOS structure, the Fermi level at the MOS interface shifts closer to the charge neutrality level from the lower edge of the conduction band. The peak wavelength is preferably longer than 1080 nm and more preferably longer than 1100 nm.

Figure 14:
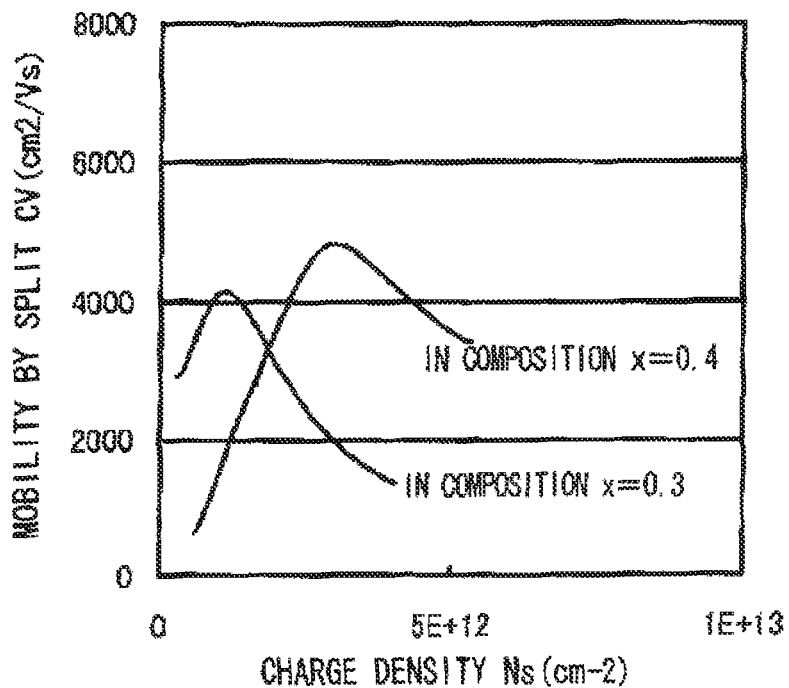
FIG. 14 is a plot of carrier mobility vs. charge density of the insulated gate field effect transistor 500 measured by a Split CV method.

FIG. 14 is a plot of carrier mobility vs. charge density of the insulated gate field effect transistor 500 measured by a Split CV method in an experiment. For comparison, a case where the In composition x of the first crystalline layer 104 was 0.3 is also shown. The Split CV method is a method of calculating a charge amount of a channel from a capacitance obtained by CV measurement of a MOSFET, and a carrier mobility from a current obtained by IV measurement using an analytical approach that is based on gradual channel approximation. Generally, a mobility obtained by Split CV method is an underestimated value, compared with a mobility obtained by Hall measurement (Van der Pauw method), because the former is affected by the charge trapped in interface states. In the experiment shown in FIG. 14, the gate length and the gate width of the insulated gate field effect transistor 500 were 100 μm and 200 μm respectively. In the measurement, the drain voltage was 0.05 V, and the gate voltage was changed in the range from −2V to +2V by 0.05 V steps.

When the In composition x of the first crystalline layer 104 was 0.4, the mobility and the charge density were greater than when x=0.3. When the In composition x was 0.4, the maximum mobility was about 5000 $cm^2$/Vs, which was high, and the charge density corresponding to the maximum mobility was about $3\times10^{12}$ $cm^{-2}$.

Figure 15:
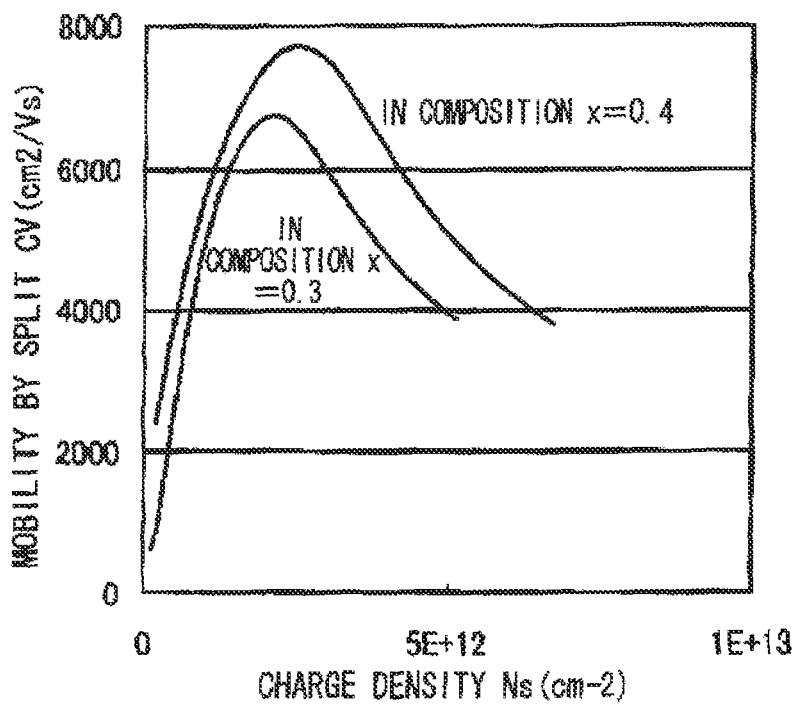
FIG. 15 is a plot of carrier mobility vs. charge density of another insulated gate field effect transistor measured by a Split CV method.

FIG. 15 is a plot of carrier mobility vs. charge density of another insulated gate field effect transistor measured by a Split CV method in an experiment. The insulated gate field effect transistor of FIG. 15 is a version of the insulated gate field effect transistor 500 in which the n-type $In_{0.48}Ga_{0.52}P$ layer of the etching stopper layer 218 was left by a thickness of 10 nm between the non-doped layer 216 and the insulating layer 106 in the gate region. As the n-type dopant, a Si atom was doped at the concentration of $3\times10^{18}$ $cm^{-3}$. The other features and the Split CV measurement conditions were the same as the insulated gate field effect transistor 500. For comparison, a case where the In composition x of the first crystalline layer 104 was 0.3 is also shown. When the In composition x of the first crystalline layer 104 was 0.4, the mobility and the charge density were greater as compared to when x=0.3. When the In composition x was 0.4, the maximum mobility was about 7800 $cm^2$/Vs, which was high, and the charge density corresponding to the maximum mobility was about $2\times10^{12}$ $cm^{-2}$, which was high. That is, by setting the In composition x of the first crystalline layer 104 to 0.4, it is possible to improve the transistor performance of this another insulated gate field effect transistor.

As compared with the results of FIG. 14, when the n-type $In_{0.48}Ga_{0.52}P$ layer, i.e., the etching stopper layer 218, was left by a thickness of 10 nm between the non-doped layer 216 and the insulating layer 106, the maximum electron mobility was improved to 7800 cm$^{-2}$/Vs from 4800 cm$^{-2}$/Vs in the case of In=0.4. A similar tendency was observed in the case of In=0.3. That is, it is preferable that the gate insulating layer be formed in contact with an InGaP layer. The n-type In$_{0.48}$Ga$_{0.52}$P layer as the etching stopper layer 218 is one example of the second crystalline layer.

Figure 16:
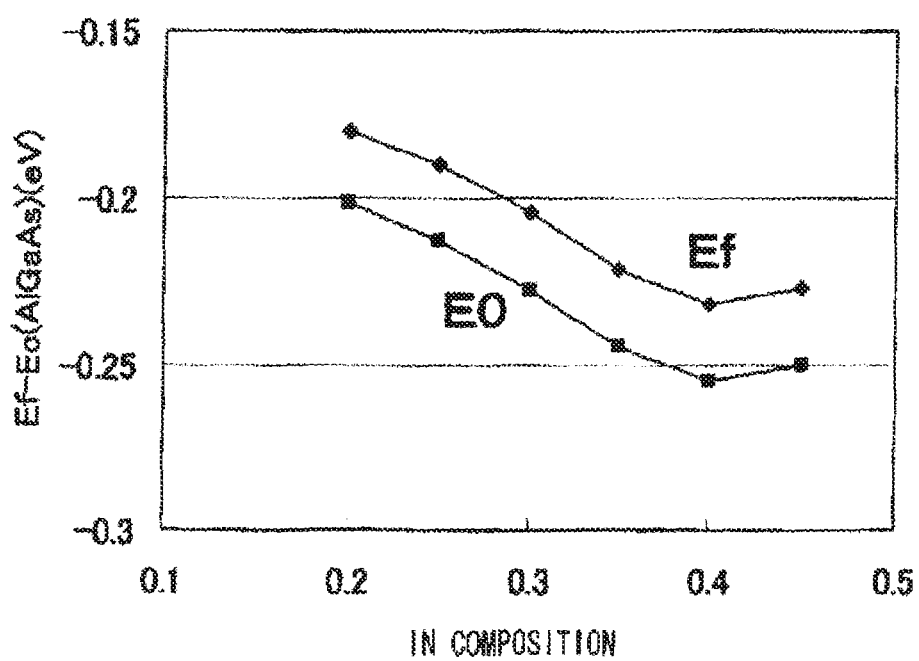
FIG. 16 is a diagram of simulated results of Fermi level ($E_f$) and ground quantum level ($E_0$) at a MOS interface with respect to changes of in composition.

FIG. 16 is a diagram of simulated results of Fermi level ($E_f$) and ground level ($E_0$) at a MOS interface with respect to changes of In composition. In this simulation, the layer structure below the gate insulating layer of the MOS transistor and the thickness of each layer were as shown in Table 1.

TABLE 1

| CRYSTALLINE LAYER | Al/In COMPO-SITION | THICK-NESS (nm) | IMPURITY CONCENTRA-TION (cm$^{-3}$) |
|---|---|---|---|
| i-AlGaAs | 0.24 | 6.0 | — |
| n-AlGaAs | 0.24 | 2.0 | Nd1 |
| i-AlGaAs | 0.24 | d3 | — |
| i-GaAs | — | d2 | — |
| i-In$_x$Ga$_{1-x}$As | x | d1 | x |
| i-GaAs | — | d2 | — |
| i-AlGaAs | 0.24 | d3 | — |
| n-AlGaAs | 0.24 | 4.0 | Nd2 |
| i-GaAs/i-Al$_{0.25}$Ga$_{0.75}$As LAYERED STRUCTURE | — | 500 | — |
| GaAs (BASE WAFER) | — | — | — |

Further, as shown in Table 2, the thickness of an i-In$_x$Ga$_{1-x}$As layer was adjusted according to the In composition, and the thickness of an i-GaAs layer was adjusted so that the distance from the MOS interface to the center of the i-In$_x$Ga$_{1-x}$As layer may be constant regardless of the In composition.

TABLE 2

| In COMPO-SITION | d1 (nm) | d2 (nm) | d3 (nm) | Nd1 (cm$^{-3}$) | Nd2 (cm$^{-3}$) |
|---|---|---|---|---|---|
| 0.20 | 13.5 | 0 | 1 | 1.34 × 10$^{18}$ | 6.68 × 10$^{17}$ |
| 0.25 | 9.5 | 1 | 2 | 1.14 × 10$^{18}$ | 5.69 × 10$^{17}$ |
| 0.30 | 7.5 | 2 | 2 | 9.99 × 10$^{17}$ | 4.99 × 10$^{17}$ |
| 0.35 | 6.5 | 2.5 | 2 | 8.43 × 10$^{17}$ | 4.21 × 10$^{17}$ |
| 0.40 | 5.5 | 3 | 2 | 7.30 × 10$^{17}$ | 3.65 × 10$^{17}$ |
| 0.45 | 4.1 | 3 | 2.7 | 7.84 × 10$^{17}$ | 3.92 × 10$^{17}$ |

Further, the impurity concentration of a doped layer was also adjusted so that the threshold voltage may be +0.2 V. The material of the gate insulating layer was assumed to be Al$_2$O$_3$, whose bandgap energy was set to 6.0 eV, and the relative permittivity was set to 7. The thickness of the gate insulating layer was set to 12 nm. The gate electrode was formed directly or indirectly on the gate insulating layer, the work function of the gate metal was set to 4.83 eV, and the gate voltage was set to −0.8 V. The energy level of approximately mid-gap at the interface between the base wafer and the buffer layer (the layered structure of an i-GaAs layer and an i-Al$_{0.25}$Ga$_{0.75}$As layer) was pinned to 0 V.

As shown in FIG. 16, the Fermi level ($E_f$) and the ground level ($E_0$) at the MOS interface were the lowest when the In composition x was about 0.4. From the results shown in FIG. 12, it can be seen that the in composition at which the Fermi level at the MOS interface was the lowest almost coincides with the In composition at which the mobility was the highest. This result is consistent with the result of experiment of FIG. 13 that high mobilities were obtained at long peak wavelengths.

As explained above, by setting the In composition of the first crystalline layer 104 of the insulated gate field effect transistor to 0.35 to 0.43, preferably to 0.36 to 0.43, it is possible to make the Fermi level at the MOS interface close to the charge neutrality level to perform MOS operations, reduce influence from the interface states at the MOS interface, and improve the carrier mobility in the first crystalline layer 104. Therefore, it is possible to improve the performance of the insulated gate field effect transistor.

In the embodiments described above, a case has been explained in which crystalline layers such as the first crystalline layer 104, etc. are formed directly or indirectly on the base wafer 102 by epitaxial growth. The method for forming the crystalline layers is not limited to such methods of directly forming the crystalline layers on the base wafer 102. For example, it is possible to form crystalline layers on the base wafer 102 by forming the crystalline layers on a crystal growth wafer different from the base wafer 102 by epitaxial growth, and then transferring only the formed crystalline layers onto the base wafer 102. The method for transferring only the crystalline layers onto the base wafer 102 may be detaching crystalline layers formed on a crystal growth wafer using lift-off technique and transferring only the detached crystalline layers onto the base wafer 102, or bonding a crystal growth wafer on which crystalline layers have been formed to the base wafer 102 such that the crystalline layer contacts the base wafer 102 and detaching the crystal growth wafer from the crystalline layer or removing the crystal growth wafer to leave the crystalline layers on the base wafer 102, etc. According to such methods of forming crystalline layers, it becomes possible to select a base wafer 102 that is made of such materials as glass, organic substances, etc. that cannot be used as an epitaxial growth wafer.

EXPLANATION OF REFERENCE NUMERALS 100 semiconductor wafer
102 base wafer
104 first crystalline layer
106 insulating layer
200 semiconductor wafer
202 buffer layer
204 doped layer
206 first spacer layer
208 second spacer layer
210 third spacer layer
212 fourth spacer layer
214 doped layer
216 non-doped layer
218 etching stopper layer
220 contact layer
300 insulated gate field effect transistor
302 gate electrode
304 source electrode
306 drain electrode
308, 310 contact region
400 semiconductor wafer
500 insulated gate field effect transistor
x In composition

The invention claimed is:
1. A semiconductor wafer, comprising:
a base wafer made of GaAs;
a first crystalline layer;
an insulating layer; and at least $In_yGa_{1-y}P$ (0<y<1) layer that is located between the first crystalline layer and the insulating layer and that can pseudo-lattice-match with GaAs or AlGaAs, wherein the base wafer, the first crystalline layer, and the insulating layer are positioned in an order of the base wafer, the first crystalline layer, and the insulating layer, the first crystalline layer is made of $In_xGa_{1-x}As$ (0.36≤x≤0.43) that pseudo-lattice-matches with GaAs or AlGaAs, the semiconductor wafer comprises a layer-stacked structure, the layer-stacked structure comprising a first spacer layer, a second spacer layer, the first crystalline layer, a third spacer layer, and a fourth spacer layer, with the layers comprised in the layer-stacked structure being stacked in a state order, the second and third spacer layers are made of GaAs layers, the first and fourth spacer layers are made of AlGaAs, and a photoluminescence peak wavelength of the first crystalline layer at 77 K is longer than 1080 nm.

2. The semiconductor wafer according to claim 1,
wherein the $In_yGa_{1-y}P$ (0<y<1) layer is in contact with the insulating layer.

3. The semiconductor wafer according to claim 2,
wherein aluminum oxide is present in a region of the insulating layer that is in contact with the $In_yGa_{1-y}P$ (0<y<1) layer.

4. An insulated gate field effect transistor, comprising the semiconductor wafer according to claim 1,
wherein the first crystalline layer of the semiconductor wafer is a channel layer, and the insulating layer of the semiconductor wafer is a gate insulating layer.

5. The semiconductor wafer according to claim 1,
wherein the first crystalline layer is a layer usable as a channel layer of a field effect transistor, and the insulating layer is a layer usable as a gate insulating layer of the field effect transistor.

6. The semiconductor wafer according to claim 1, further comprising
a buffer layer located between the base wafer and the first crystalline layer.

7. The semiconductor wafer according to claim 6,
wherein the buffer layer is a layer including at least one of GaAs and AlGaAs.

* * * * *